(12) United States Patent
Szu

(10) Patent No.: US 7,914,314 B2
(45) Date of Patent: Mar. 29, 2011

(54) ELECTRICAL CONTACT WITH MULTIPLE CONTACTING POINTS

(75) Inventor: Ming-Lun Szu, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/549,399

(22) Filed: Aug. 28, 2009

(65) Prior Publication Data
US 2010/0055996 A1   Mar. 4, 2010

(30) Foreign Application Priority Data
Sep. 1, 2008 (TW) ............................ 97215672 U (51) Int. Cl.
*H01R 13/625* (2006.01)
(52) U.S. Cl. ..................................... 439/342; 439/260
(58) Field of Classification Search ................ 439/342, 439/260, 82
See application file for complete search history.

(56) References Cited

U.S. PATENT DOCUMENTS

| | | | | |
|---|---|---|---|---|
| 5,616,044 A * | 4/1997 | Tsai | ............................ | 439/342 |
| 6,471,534 B1 * | 10/2002 | Lee | ............................ | 439/342 |
| 6,537,095 B1 * | 3/2003 | Azuma | ...................... | 439/342 |
| 7,052,336 B2 * | 5/2006 | Tsai | ............................ | 439/857 |
| 7,186,122 B2 * | 3/2007 | Haga | ............................ | 439/82 |
| 2003/0096525 A1 * | 5/2003 | Hsu | ............................. | 439/342 |

FOREIGN PATENT DOCUMENTS

| | | |
|---|---|---|
| CN | 2686128 | 3/2005 |
| CN | 2821906 | 9/2006 |
| CN | 2826741 | 10/2006 |

* cited by examiner

*Primary Examiner* — Hien Vu
(74) *Attorney, Agent, or Firm* — Andrew C. Cheng; Wei Te Chung; Ming Chieh Chang (57) ABSTRACT

An electrical contact comprises a contacting end having a slot tapered toward a free end of the contacting end, the slot defining opposite inner walls, a first, second contacting points being formed on the opposite inner walls respectively at a narrow part of the slot. A third contacting point extends from one of the opposite inner walls at the narrow part of the slot. A pin of a CPU can synchronously engage with the three contacting points. Thus, improved engagement between the pin and the contact will be provided.

7 Claims, 9 Drawing Sheets

ELECTRICAL CONTACT WITH MULTIPLE CONTACTING POINTS

BACKGROUND OF THE INVENTION

1. Field of the Invention

The present invention relates to an electrical contact, and more particularly to an electrical contact having a box-type contact engaging portion providing reliable and multiple engagements with an inserted pin leg of an IC package.

2. Description of Prior Art

Figure 1:
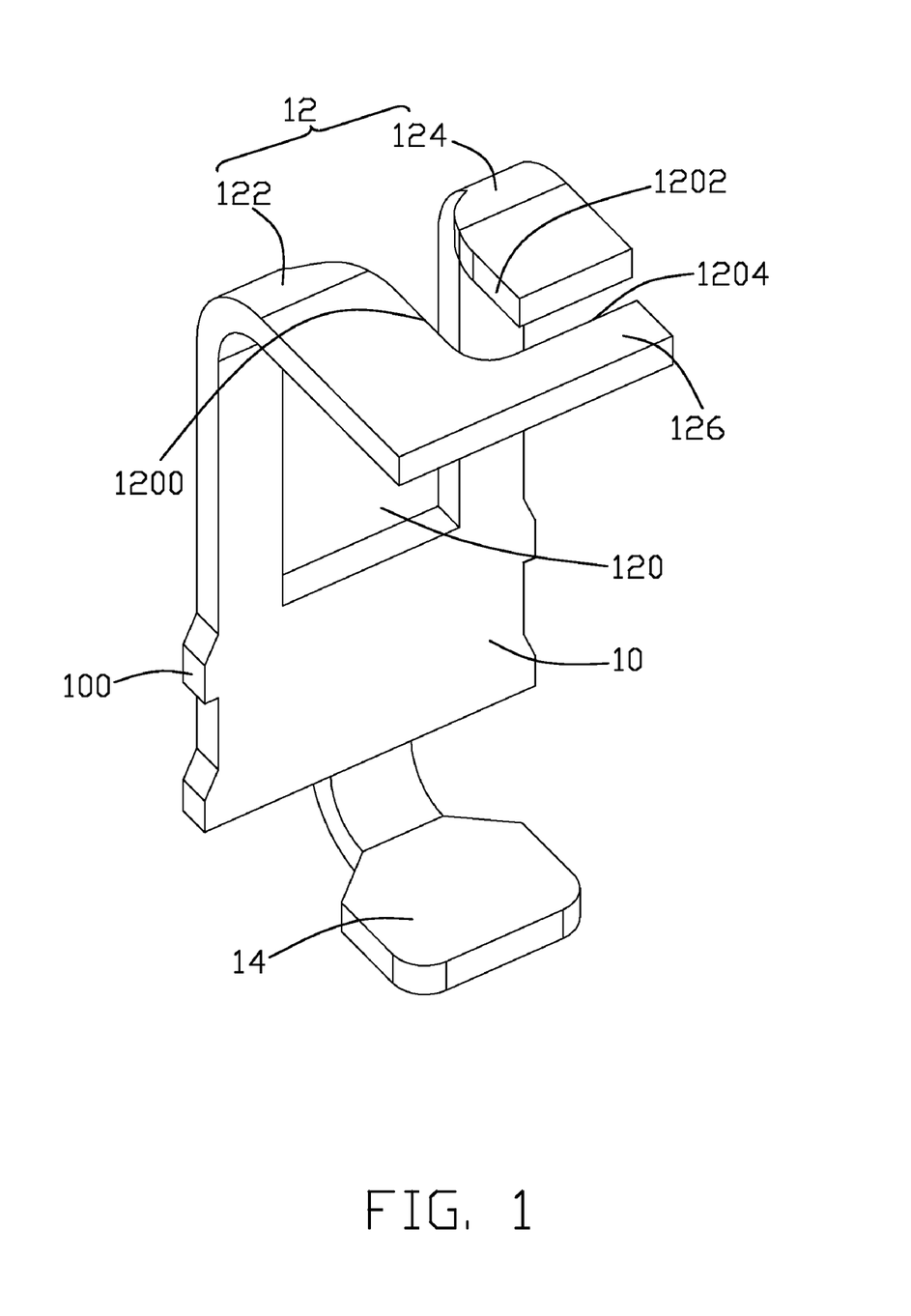
FIG. 1 is a perspective views of an electrical contact in accordance with a first embodiment of the present invention.
Figure 2:
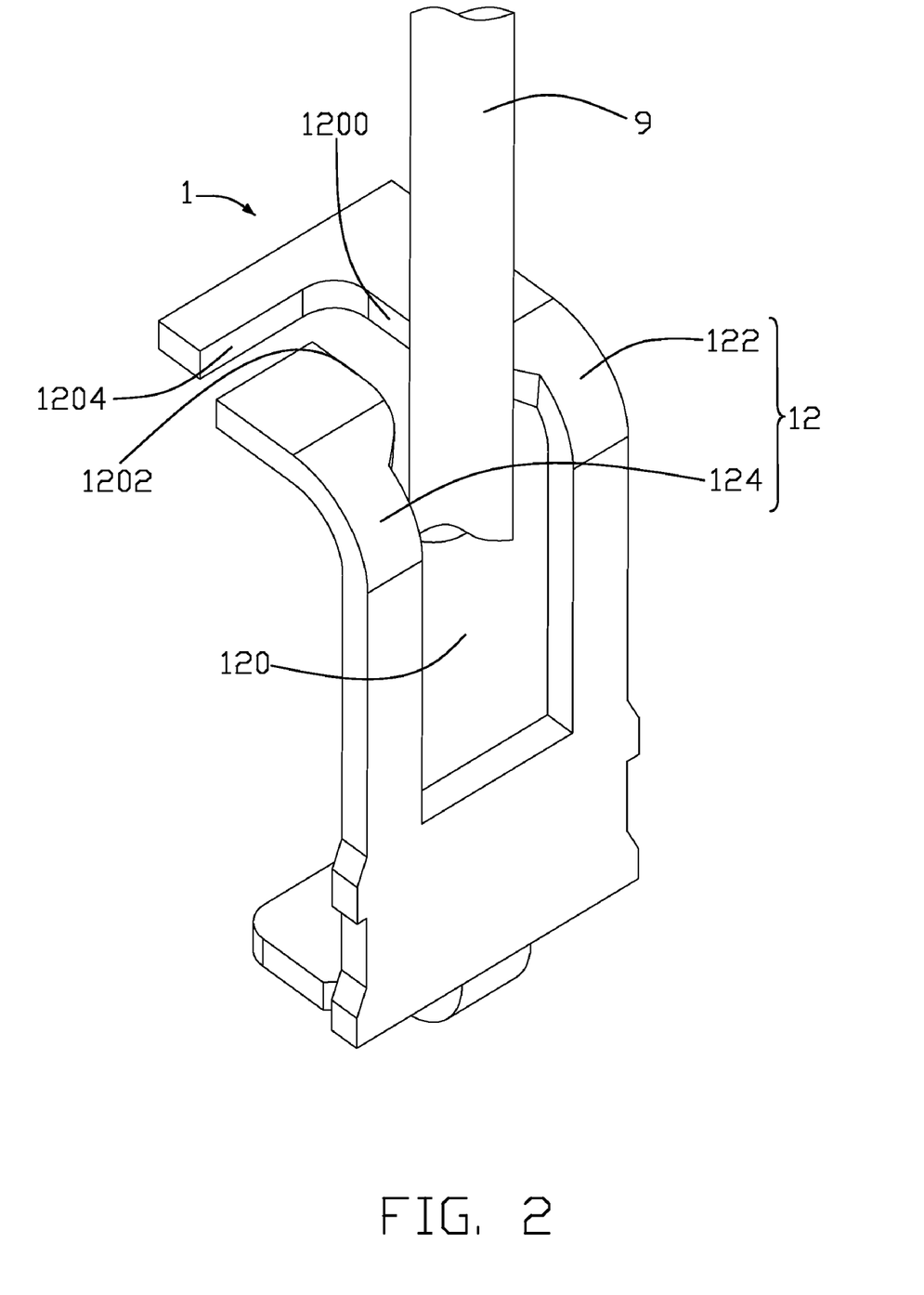
FIG. 2 is a perspective views of an electrical contact in accordance with a first embodiment of the present invention, showing a pin is at a first position.
Figure 2A:
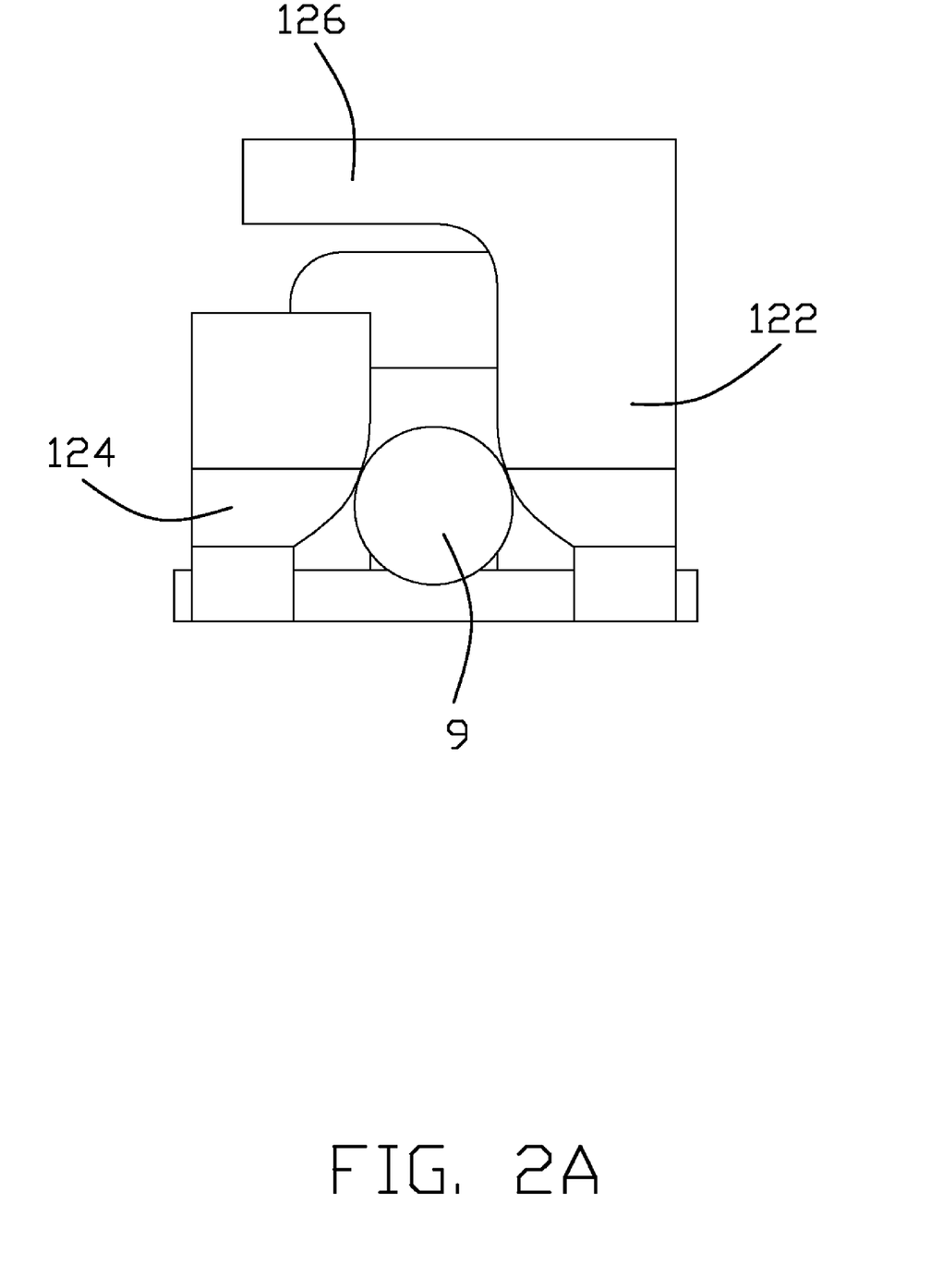
FIG. 2A is a top view of the FIG. 2.

Chinese patent No. CN2686128 issued on Mar. 16, 2005 discloses a conventional contact for an electrical socket, as is shown in FIGS. 1-2. The contact 10 comprises a base 20 and a pair of arm sections 21 extending upwardly from the base 20. A slot 21 is defined between the two arm sections 21. As is indicated in FIG. 1, a pin 90 of a CPU is inserted into the slot 21 and will engage with the contact 10.

However, each contact region 21 only provides one contacting point for engaging with the pin 90. Thus, electrical engagement is unsteady.

In view of the above, an improved electrical contact that overcomes the above-mentioned disadvantages is desired.

SUMMARY OF THE INVENTION

Accordingly, an object of the present invention is to provide an electrical contact having multiple contacting points for providing improved engagement with a pin of an electronic package.

To achieve the above-mentioned object, an electrical contact comprises a contacting end having a slot tapered toward a free end of the contacting end, the slot defining opposite inner walls, a first, second contacting points being formed on the opposite inner walls respectively at a narrow part of the slot. A third contacting point extends from one of the opposite inner walls at the narrow part of the slot. A pin of a CPU socket can simultaneously engage with the three contacting points. Thus, improved engagement between the pin and the contact is provided.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 3:
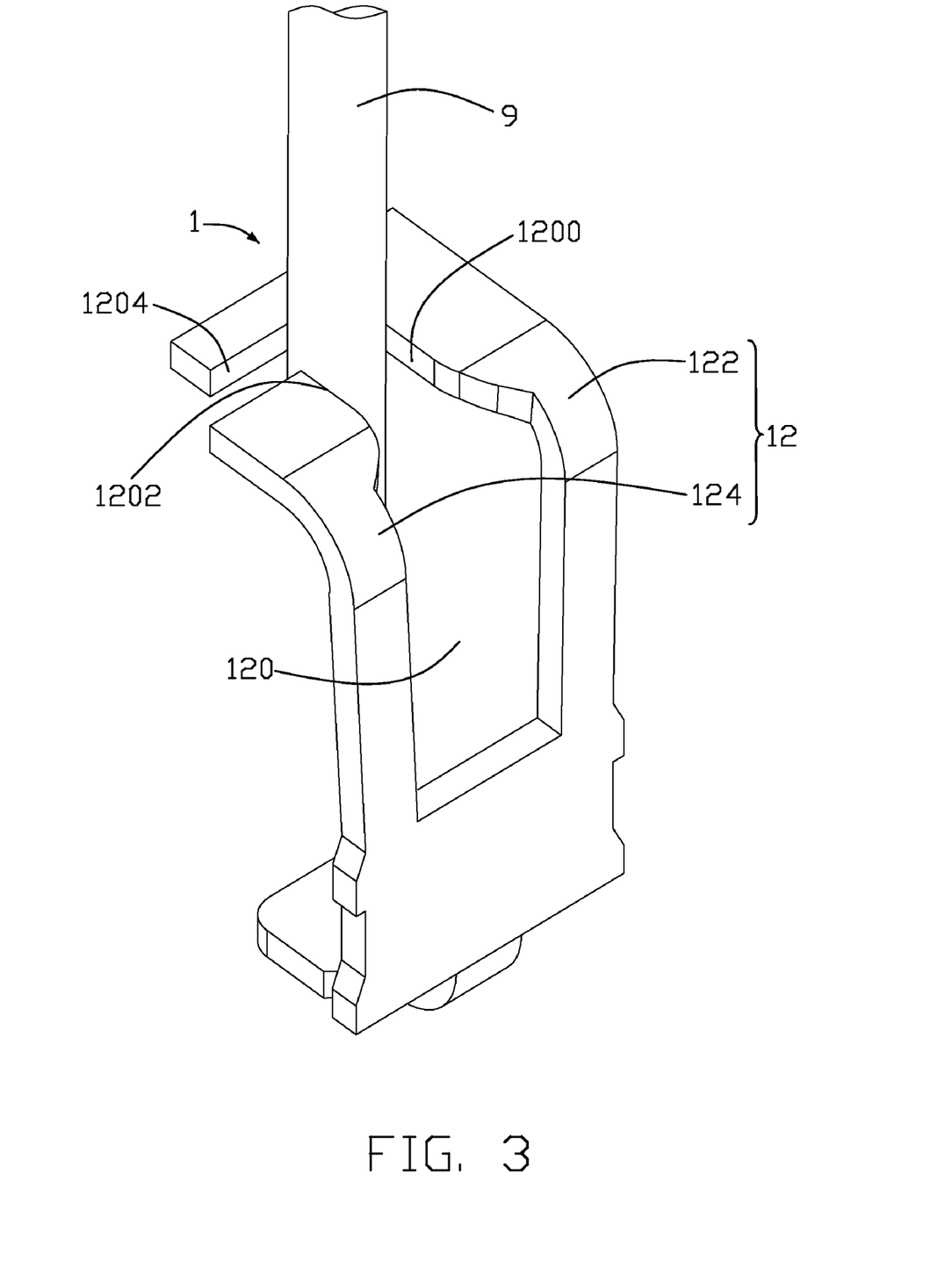
FIG. 3 is a perspective views of an electrical contact in accordance with a first embodiment of the present invention, showing a pin is at a second position and engaging with the contact.
Figure 3A:
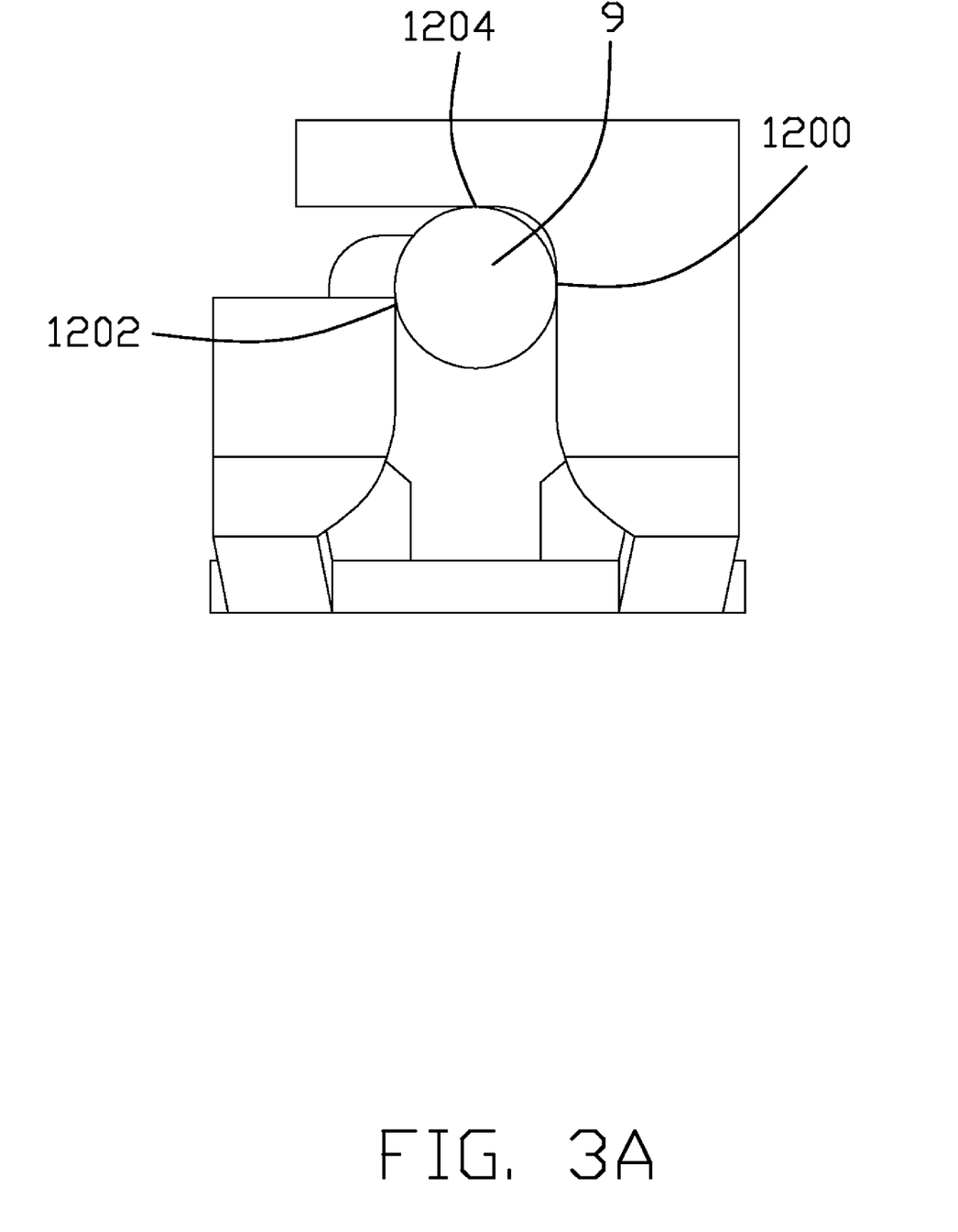
FIG. 3A is a top view of the FIG. 3.
Figure 4:
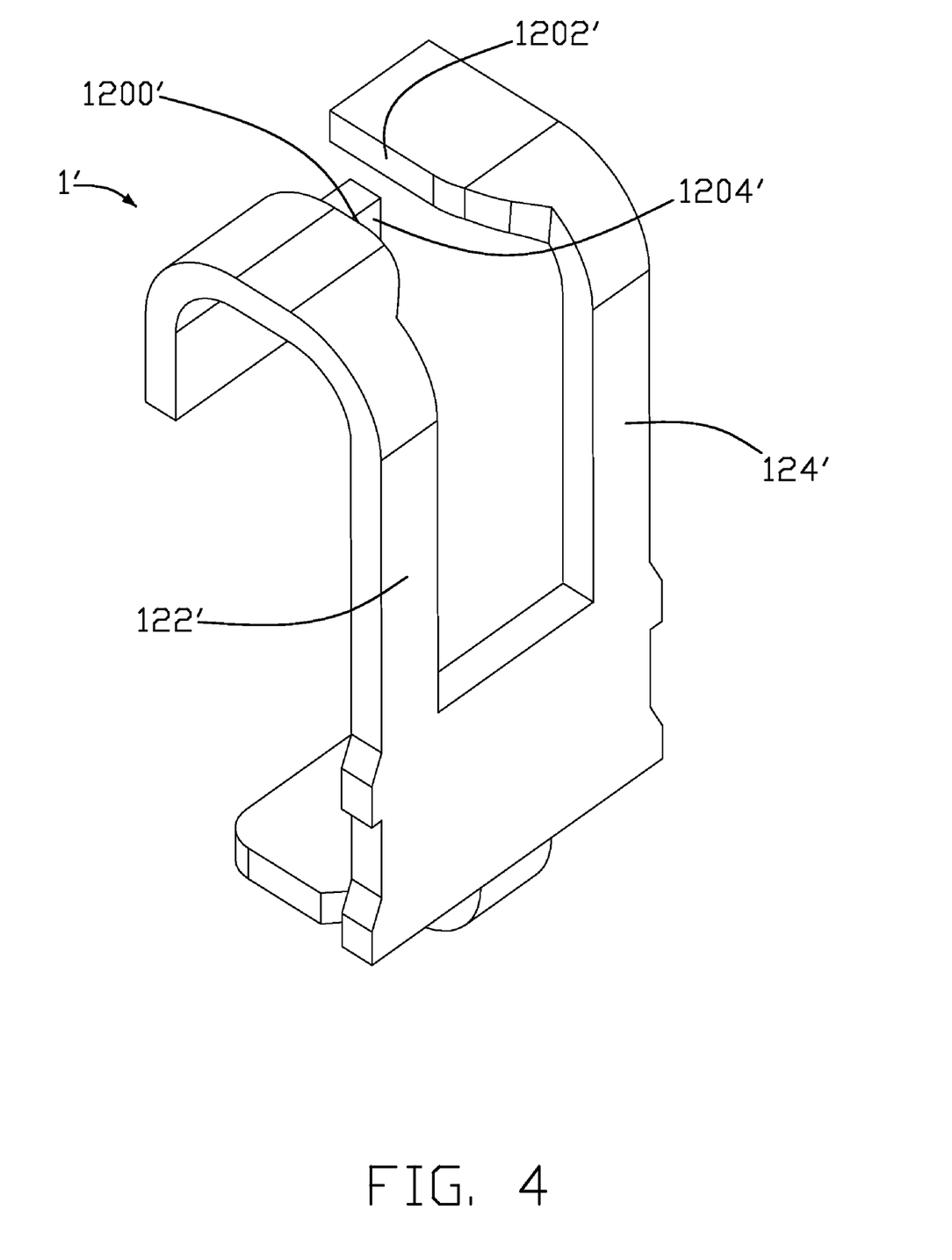
FIG. 4 is a perspective views of an electrical contact in accordance with a second embodiment of the present invention.
Figure 5:
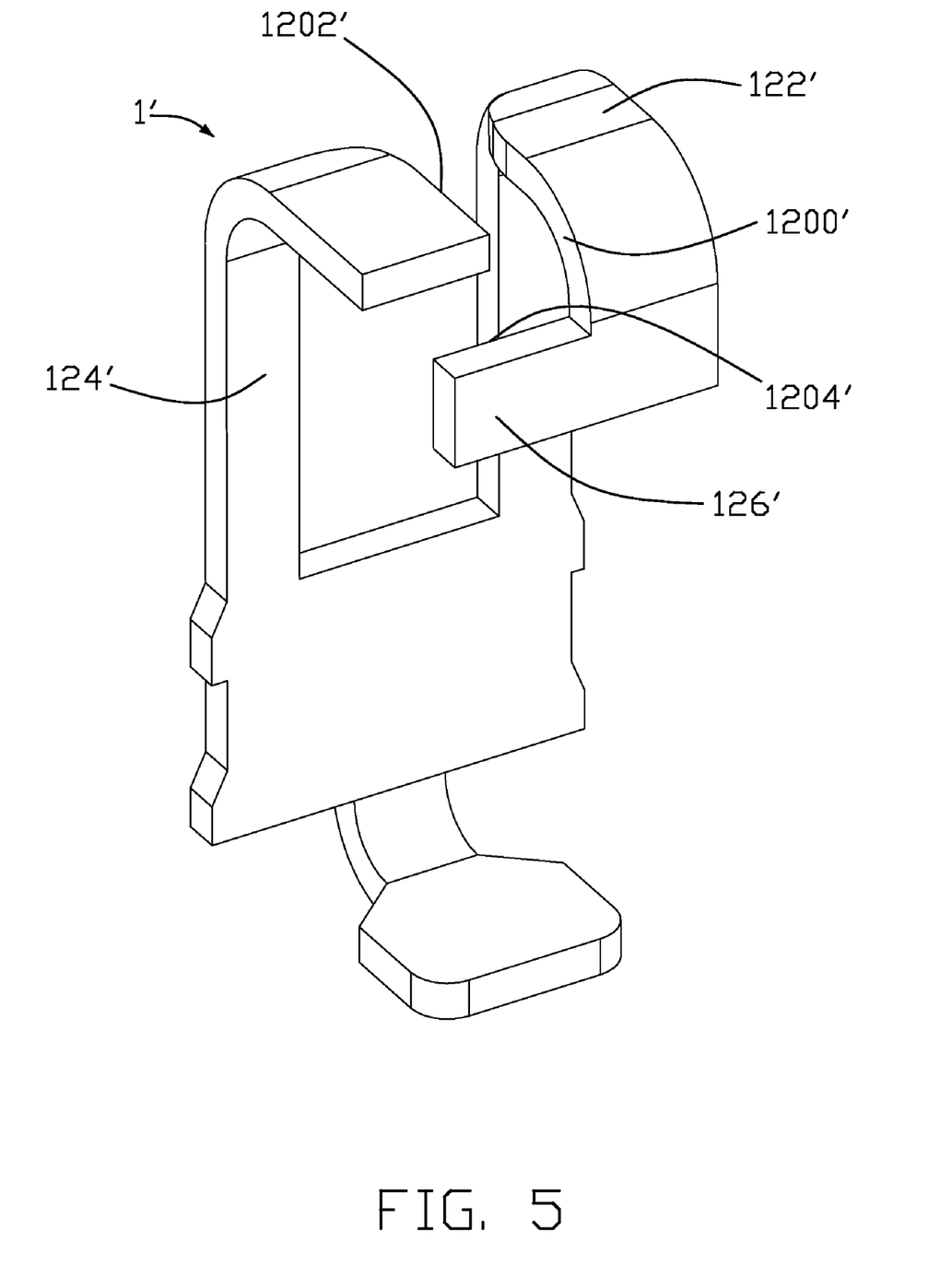
FIG. 5 is a perspective views of an electrical contact in accordance with a second embodiment of the present invention, from another view.
Figure 6:
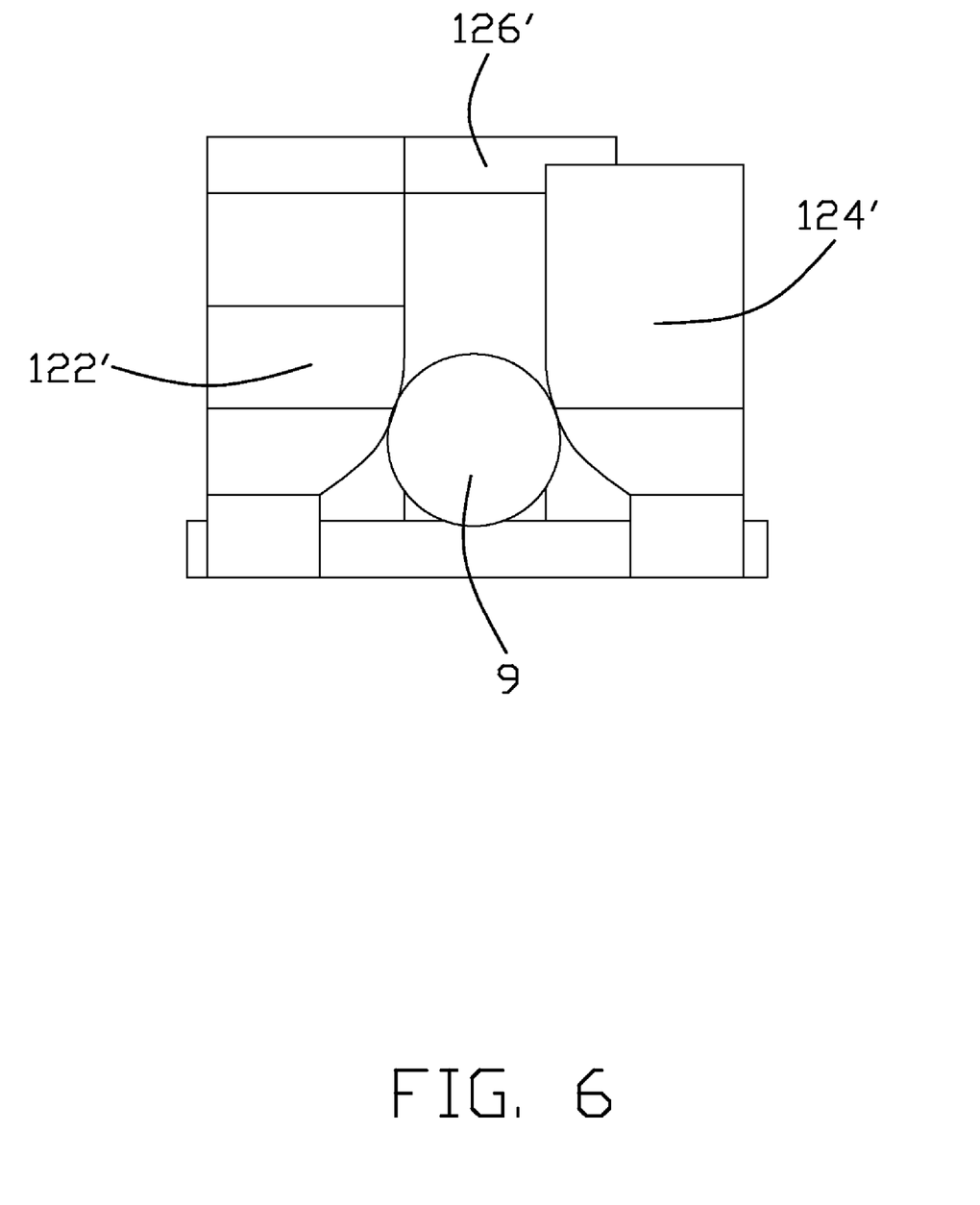
FIG. 6 is a top view of the contact in accordance with a second embodiment, showing a pin is at a first position.
Figure 7:
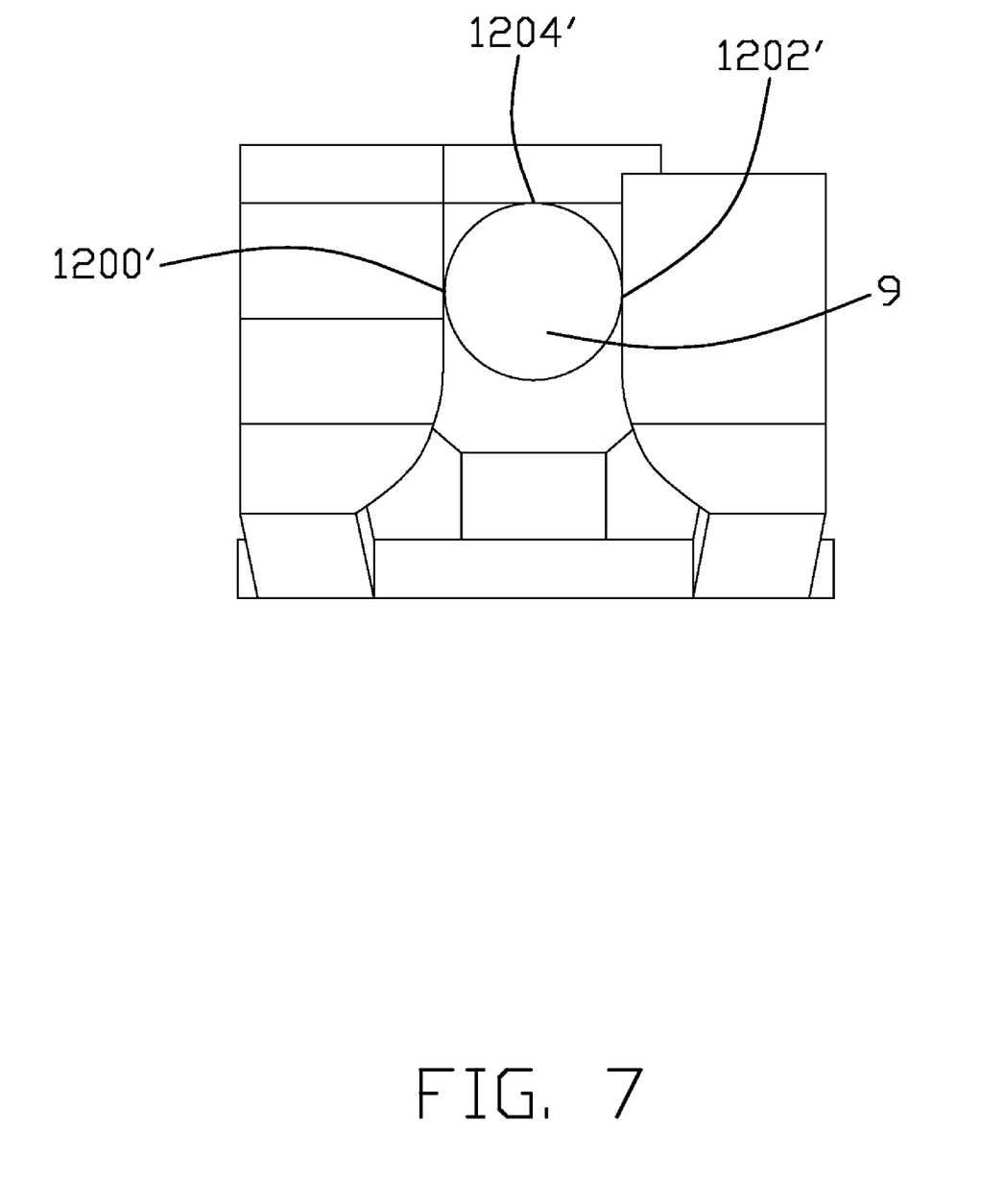
FIG. 7 is a top view of the contact in accordance with a second embodiment, a pin is at a second position and engaging with the contact.

Referring to FIGS. 1-3, an electrical contact 1 in accordance with a first preferred embodiment of the present invention is used for electrically connecting an electrical package (not shown), e.g. a CPU with a PCB (not shown). The contact 1 comprises a base 10 for securing the contact 1 in a CPU socket, a contacting end 12 extending from one end of the base 10, and a solder section 14 extending from an opposite end of the base 10.

Initially, the contacting end 12 extends upwardly from the base 10 in the vertical direction, and then extends in the horizontal direction. The contacting end 12 defines a slot 120 thereon tapered toward a free end of the contacting end 12. The slot 120 extends along a direction, which is not parallel to the horizontal direction. Referring to FIG. 2, the slot 120 defines opposite inner walls and defines a narrow part and a wider part. The slot 120 is formed with a first contacting point 1200, second contacting point 1202 at opposite inner walls of the narrow part, respectively. Initially, the pin 9 is guided in the wider part (at which position the pin 9 is shown in FIG. 2), for subsequent engagement with the first contacting point 1200, second contacting point 1202. The pin 3 is then slid from the wider part into the narrow part (at which position the pin 9 is shown in FIG. 3). As a result, the pin 9 engages with the first, and second contacting points 1200, 1202. In the first embodiment, the slot 120 extends through the contacting end 12 in a thickness direction of the contacting end 12.

In the first embodiment, the slot 120 extends through the contacting end 12 in an extending direction of the contacting end 12. Therefore, the contacting end 12 is divided into two spaced arms, first arm 122 and second arm 124. Moreover, the first, second arms 122, 124 are symmetrically disposed with respect to the base 10. The first contacting point 1200 is formed on interior side of the first arm 122, and the second contacting point 1202 is formed on interior side of the second arm 124. Specially, the first, second arms 122, 124 are in a same plane.

Referring to FIG. 2, a third arm 126 extends vertically from a free end of the first arm 122 toward the second arm 124. In other words, the third arm 126 extends from one inner wall (interior side of the first arm 122) of the narrow part of the slot 120. In this embodiment, the free end of the first arm 122 extends beyond a free end of the second arm 124. Accordingly, the third arm 126 is located ahead of the free end of the second arm 124 in the extending direction of the second arm 124. The third arm 126 defines a third contacting point 1204 at a side approaching the first and second arm 124. In this preferred embodiment, the first contacting point 1200, second contacting point 1202 and third contacting point 1204 are disposed in a same plane, which is generally extending in a horizontal direction.

Referring to FIG. 2-3, the pin 9 is inserted into space of the wider part of the slot 120, and then the pin 3 is slid from the wider part into the narrow part to synchronously engage with the first contacting point 1200, second contacting point 1202 and the third contacting point 1204. By way above-mentioned, improved engagement between the pin 9 and the contact 1 is provided.

Reference is now made to FIGS. 4-7; a second embodiment in accordance with the present invention is shown. The contact 1' is similar to the contact 1 and comprises a first arm 122', second arm 124' spaced to the first arm 122', and a third arm 126 extending from a free end of the first arm 122' toward the second arm 124'. The first arm 122' has a first contacting point 1220', and the second arm 124' has a second contacting point 1222', and the third arm 126' has a third contacting point 1224'. In the second embodiment, the free end of the first arm 122' is of a curved shape. Accordingly, third contacting point 1224' is located in a vertical plane, which is perpendicular to the plane in which the first and second contacting points are located.

In the second embodiment, a pin (not shown) can synchronously engage with the first contacting point 1200', second contacting point 1202' and the third contacting point 1204'. By way above-mentioned, improved engagement between the pin and the contact 1 will be provided.

What is claimed is:

1. An electrical contact, comprising:
   a base;
   a solder section extending from one end of the base;
   a contacting end extending from another end of the base and defining a first arm, second arm opposite to each other, the two arms defining a guiding space and a contacting space; wherein
   the first arm and second arm defines a first contacting point and a second contacting point corresponding to the contacting space, respectively, and a third arm extends from the first arm and is formed with a third contacting point corresponding to the contacting space and opposite to an entrance defined by first and second arms;
   wherein the first arm and the second arm are formed by a slot extending through the contacting end in an extending direction of the contacting end;
   wherein free end of the first arm is of a curved shape;
   wherein the first and second contacting points are in a same plane, while the third contacting point is in a different plane; and
   wherein the base and portions of the first and second arms are aligned and extended vertically.

2. The electrical contact as claimed in claim 1, wherein the slot extends through the contacting end in a thickness direction of the contacting end.

3. The electrical contact as claimed in claim 1, wherein the plane of the third contacting point is perpendicular to the plane of the first and second contacting points.

4. The electrical contact as recited in claim 1, wherein the guiding space is configured to allow a pin to be horizontally inserted thereinto from an exterior and further moved toward the contacting space and the third contacting point.

5. An electrical contact terminal for engaging with a pin of an electronic component, comprising:
   an elongate planar portion;
   a contact engaging portion extending vertically from and orthogonal to the planar portion;
   a slot arrangement extending through both the elongate planar portion and the contact engaging portion and having an exit in the contact engaging portion;
   wherein the slot arrangement is dimensioned with a first opening in the planar portion, and a second opening in the contact engaging portion and communicated with the exit; and
   wherein the contact engaging portion further includes a tab orthogonal to the contact engaging portion and substantially parallel to the planar portion; and
   wherein the second opening defines a pair of contacting points disposed at opposite inner walls respectively, the tab defining an auxiliary contacting point capable of engaging with the pin jointly with the pair of contacting points at the same time.

6. The electrical contact terminal as recited in claim 5, wherein the contact terminal includes a mounting portion.

7. The electrical contact terminal as recited in claim 5, wherein the exit and the auxiliary contact point are respectively located by two opposite ends of the second opening in a horizontal direction along which a pin is inserted into the second opening from an exterior.

* * * * *